United States Patent
Yoshikawa

(10) Patent No.: US 8,241,926 B2
(45) Date of Patent: Aug. 14, 2012

(54) SEMICONDUCTOR INTEGRATED CIRCUIT TEST METHOD

(75) Inventor: Yasuhiro Yoshikawa, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 361 days.

(21) Appl. No.: 12/710,377

(22) Filed: Feb. 23, 2010

(65) Prior Publication Data

US 2010/0213963 A1    Aug. 26, 2010

(30) Foreign Application Priority Data

Feb. 26, 2009    (JP) ................................. 2009-044022

(51) Int. Cl.
*G01R 31/26* (2006.01)
*G01R 31/00* (2006.01)
*G01R 31/02* (2006.01)
*H01L 21/66* (2006.01)

(52) U.S. Cl. ... 438/15; 438/17; 324/756.03; 324/762.05

(58) Field of Classification Search .............. 438/14–18; 324/754, 525, 421, 691; 29/593, 855; 257/48
See application file for complete search history.

(56) References Cited

U.S. PATENT DOCUMENTS

| | | | | |
|---|---|---|---|---|
| 6,727,723 | B2 * | 4/2004 | Shimizu et al. | 324/750.05 |
| 7,179,662 | B2 * | 2/2007 | Eldridge | 438/14 |
| 2002/0000650 | A1 * | 1/2002 | Smith et al. | 257/692 |
| 2005/0003635 | A1 * | 1/2005 | Takekoshi | 438/464 |
| 2006/0121633 | A1 * | 6/2006 | Takeoka et al. | 438/15 |
| 2008/0251913 | A1 * | 10/2008 | Inomata | 257/737 |
| 2009/0042322 | A1 * | 2/2009 | Anzai | 438/17 |

FOREIGN PATENT DOCUMENTS

JP    2005-123291    5/2005
JP    2005-136056    5/2005

* cited by examiner

*Primary Examiner* — Melissa Koval
*Assistant Examiner* — Julio C Diaz Perez
(74) *Attorney, Agent, or Firm* — Volentine & Whitt, PLLC

(57) ABSTRACT

A wafer of semiconductor integrated circuits with wafer-level chip-scale packages is tested in two stages. The chip-scale packages include conductive posts extending through a sealing layer and capped by terminals. Measurements strongly affected by contact resistance are carried out before the terminals are formed, using a first probe card having probe pins that contact the ends of the conductive posts. Other measurements are carried out after the terminals are formed, using a second probe card having probe pins that contact the terminals. Accurate measurements can be made in this way even if the terminals are lead-free solder bumps with variable contact resistance. Fabrication yields are improved accordingly.

13 Claims, 7 Drawing Sheets

SEMICONDUCTOR INTEGRATED CIRCUIT TEST METHOD

BACKGROUND OF THE INVENTION

1. Field of the Invention

The present invention relates to the testing of semiconductor integrated circuit chips, more particularly to the testing of semiconductor integrated circuit chips having a package with a grid array of terminals on one surface.

2. Description of the Related Art

In the field of semiconductor integrated circuit chip packaging, there has been a growing demand for smaller and thinner packages. This has led to the development of the chip scale package (CSP), which is the same size as the chip itself, or only slightly larger. This type of package can be formed in the wafer processing stage, before the wafer is diced into chips, in which case the package is referred to as a wafer-level chip scale package (W-CSP). Chip scale packages normally have a grid array of hemispherical terminals on one surface of the package, and are sometimes referred to as area array packages. The hemispherical terminals are formed on the ends of conductive posts that lead from the package surface through a sealing layer to the circuitry below.

The electrical characteristics of a semiconductor integrated circuit chip in an area array package are normally tested after the hemispherical terminals have been formed, by establishing electrical contact between the hemispherical terminals and a set of electrodes referred to as probe pins, probe needles, pogo pins, or cantilevers, and measuring the electrical characteristics of the circuit elements inside the chip. The probe pins are also used to 'burn in' the chip by operating it at an elevated temperature.

One problem with this testing method is that for environmental reasons, the hemispherical terminals are now generally made of a lead-free solder, which has a comparatively high contact resistance. Consequently, analog electrical characteristics such as the on-resistance of transistors cannot be measured accurately, so an extra pass-fail margin has to be allowed to provide for measurement error, and production yields are reduced accordingly.

Another problem is that the hemispherical terminals may be deformed during the burn-in process.

In a test method disclosed by Wakabayashi et al. in Japanese Patent Application Publication No. 2005-123291 (now Japanese Patent No. 3757971), the burn-in procedure is carried out in the wafer state, after the conductive posts and the sealing layer have been formed, by touching the probe pins to the ends of the conductive posts. After burn-in, the hemispherical terminals are formed as solder bumps, and then the electrical tests are carried out by touching the probe pins to the hemispherical terminals. This procedure avoids deformation of the hemispherical terminals during the burn-in process, but does not solve the problem of contact resistance and measurement error during the electrical tests.

In a test method disclosed by Nakano et al. in Japanese Patent Application Publication No. 2005-136056, contact between the probe pins and the hemispherical terminals is avoided completely by conducting the electrical tests at an intermediate stage of the packaging process before the hemispherical terminals are formed. The probe pins touch either the conductive posts or a layer of redistribution traces on which the conductive posts are seated. After electrical tests have been completed, the redistribution traces and posts are covered with a dielectric layer and a passivation layer, holes are formed in the passivation layer, and hemispherical terminals are formed in the holes to complete the package. The problem of contact resistance is thereby avoided, but since the electrical tests are carried out while the wafer is still in process, electrical problems that may arise in subsequent processing steps go undetected. More specifically, problems that arise during the formation of the dielectric and passivation layers and in particular during the opening of holes in the passivation layer and the formation of the hemispherical terminals go undetected.

SUMMARY OF THE INVENTION

An object of the present invention is to test semiconductor integrated circuits accurately.

Another object of the invention is to improve fabrication process yields by reducing measurement error margins.

Another object is to reduce the cost of semiconductor integrated circuits.

The invention provides a novel method of testing the electrical characteristics of a plurality of semiconductor integrated circuits formed on a wafer.

The method starts from the forming of a plurality of conductive posts on the wafer. The conductive posts make electrical contact with interconnection wiring of the integrated circuits, and will form part of the packages of the integrated circuits. After the conductive posts are formed, a sealing layer is formed on the wafer, covering the interconnection wiring and exposing the ends of the conductive posts.

A first probe card is mounted in a testing machine and is used to measure a first set of electrical characteristics of the semiconductor integrated circuits. The first probe card has probe pins positioned to make electrical contact with the ends of at least some of the conductive posts.

Next, terminals are formed on the ends of the conductive posts. The terminals may be formed as solder bumps.

A second probe card is now mounted in the testing machine and used to measure a second set of electrical characteristics of the semiconductor integrated circuits. The second probe card has probe pins positioned differently from the probe pins of the first probe card. The probe pins of the second probe card make electrical contact with at least some of the terminals formed on the conductive posts.

The first probe card can be used to measure electrical characteristics that are significantly affected by probe pin contact resistance. The accuracy of these measurements is improved because the highly variable contact resistance of the terminals is eliminated.

The second probe card can be used to measure electrical characteristics that are significantly affected by interference between different semiconductor integrated circuits. The accuracy of these measurements can be improved by dicing the wafer into chips before the measurements are carried out.

More accurate measurement improves fabrication yields by enabling defective chips to be distinguished more accurately from non-defective chips, so that less margin for measurement error is required.

Improved fabrication yields translate into reduced cost per chip.

DETAILED DESCRIPTION OF THE INVENTION

Figure 1:
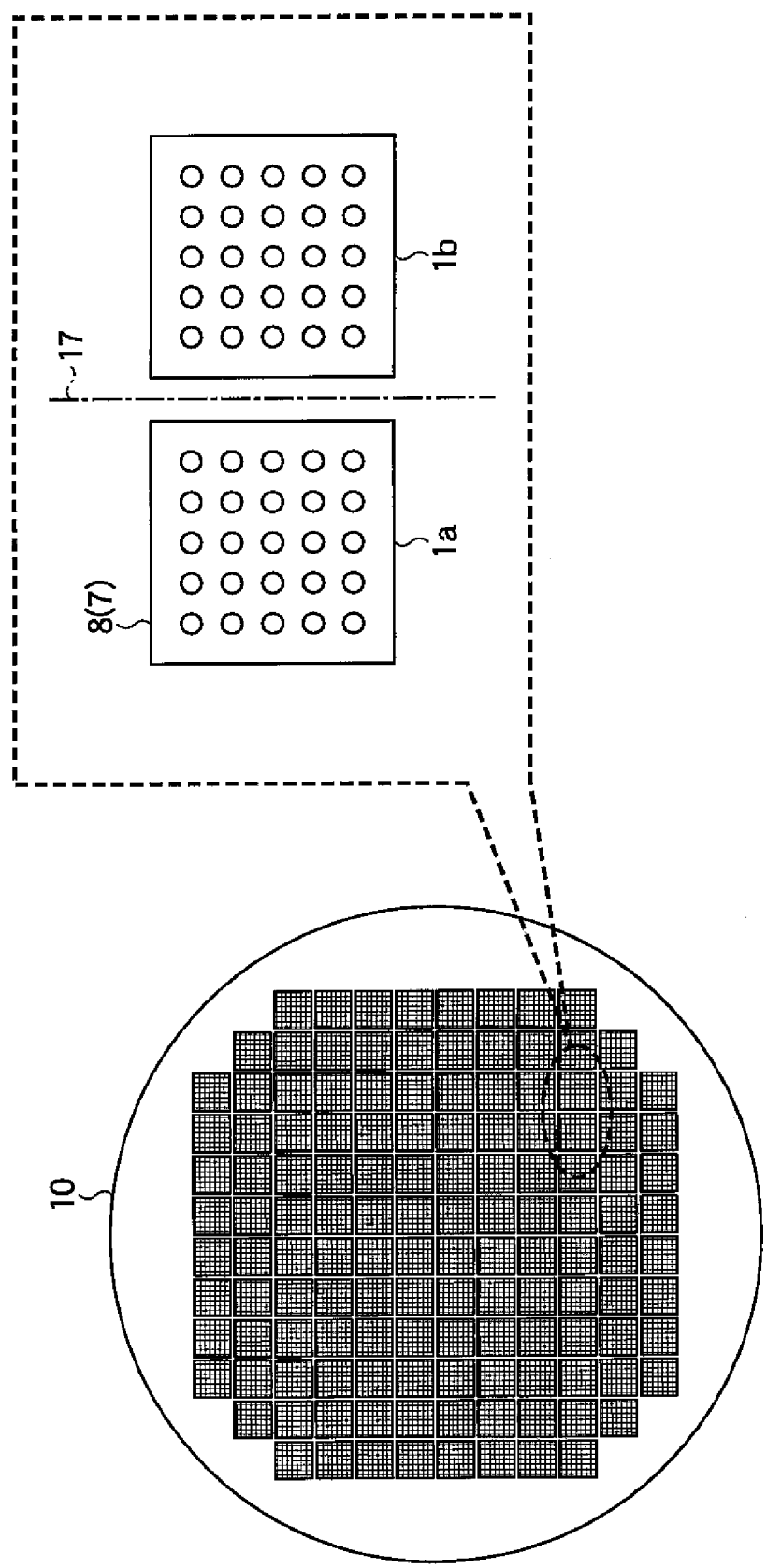
FIG. 1 shows a plan view of a semiconductor wafer and an enlarged view of two semiconductor integrated circuits or chips formed on the semiconductor wafer.

An embodiment of the novel method will now be described with reference to the attached drawings, in which like elements are indicated by like reference characters.

FIG. 1 shows a pair of semiconductor integrated circuits, 1a, 1b which are two of a plurality of identical semiconductor integrated circuits formed on a wafer 10. Each integrated circuit includes a wafer-level chip scale package and a grid array of solder bumps 8 formed as external terminals on the package surface. The solder bumps 8 are formed on the ends of copper posts 7 by which the solder bumps 8 are electrically connected to the integrated circuitry below. The copper posts 7 are formed in the same positions as the solder bumps 8 and the ends of the copper posts 7 are exposed on the package surface until being covered by the solder bumps 8.

Each pair of mutually adjacent semiconductor integrated circuits 1a, 1b are separated by a dicing line 17. The wafer 10 is diced into chips along the dicing lines 17 by a blade dicing tool or a laser dicing process, each chip becoming a complete packaged integrated circuit. The dicing process forms grooves that are only about thirty micrometers (30 μm) wide, or less. The individual integrated circuits (also referred to below as chips, even before the wafer 10 has actually been diced into chips) can therefore be arranged close together on the wafer surface, which is desirable because it enables a large number of chips to be formed at once, thereby improving the yield of the fabrication process. If the chips are packed too closely together, however, they may be damaged by mechanical or thermal stress during the dicing process, and problems of chip-to-chip electrical interference may arise when the wafer is tested, if multiple chips are tested simultaneously.

Figure 2:
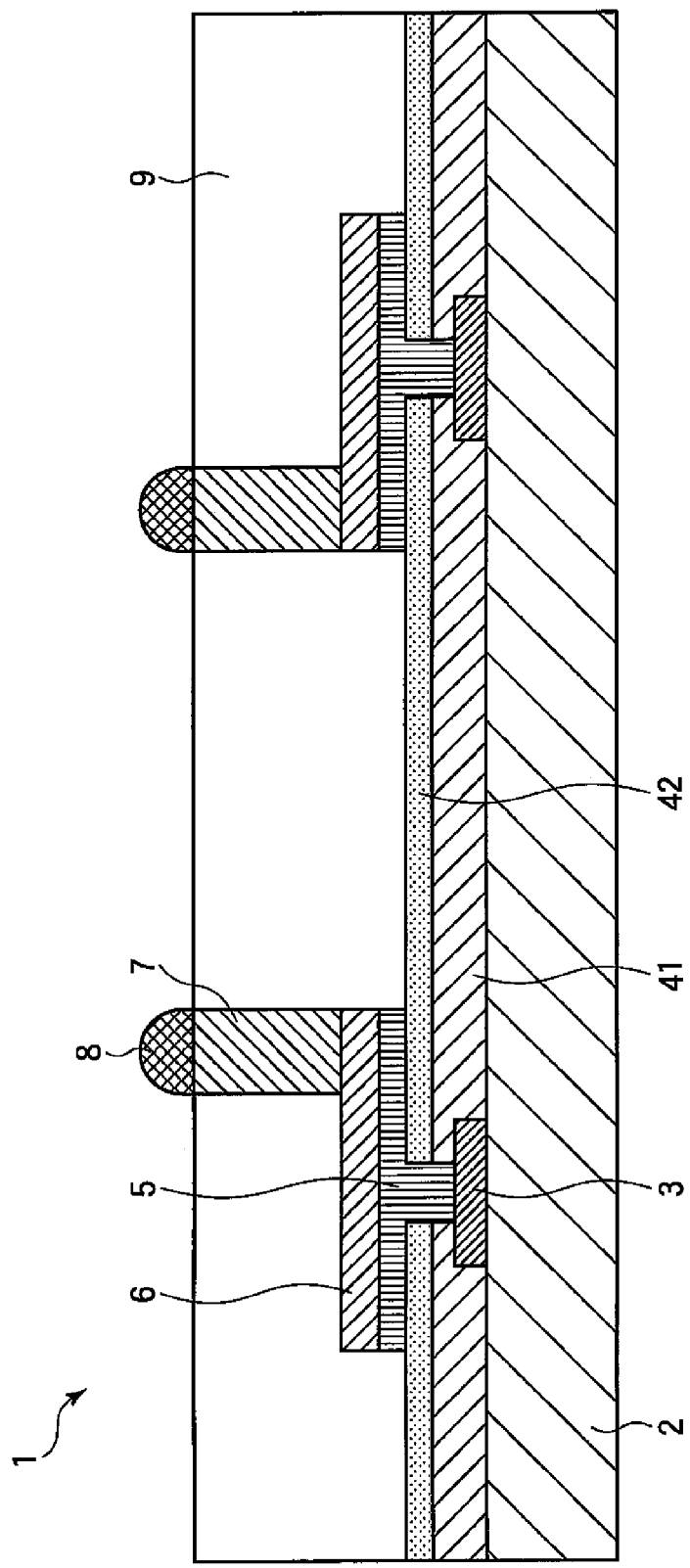
FIG. 2 is a sectional view of part of one of the semiconductor integrated circuits in FIG. 1.

Referring to the sectional view in FIG. 2, each chip or semiconductor integrated circuit 1 includes a silicon substrate 2 on which semiconductor circuit elements such as metal-oxide-semiconductor field-effect transistors (MOSFETs, not visible) and electrode pads 3 such as MOSFET source, gate, and drain electrode pads are formed. The electrode pads 3 are made of a conductive material such as aluminum. The silicon substrate 2 and electrode pads 3 are covered by a dielectric layer 41 and a passivation layer 42 that provide electrical insulation. The dielectric layer 41 comprises, for example, silicon oxide or silicon nitride; the passivation layer 42 comprises a polymer material such as polyimide.

Holes extend through the dielectric layer 41 and passivation layer 42 to the electrode pads 3. A patterned barrier metallization layer 5 that fills the holes is formed on the passivation layer 42 to make electrical contact with the electrode pads 3. The barrier metallization layer 5 comprises a material such as tungsten or copper that has a low electrical resistance and good adherence to the passivation layer 42, and can prevent diffusion into the passivation layer 42.

A redistribution metallization layer 6 is formed on the barrier metallization layer 5. The redistribution metallization layer 6 is also made of a material of low electrical resistance, such as gold, copper, or aluminum. The barrier metallization layer 5 and redistribution metallization layer 6 are patterned to form interconnection wiring traces from the positions of the electrode pads 3 to grid point positions beneath the solder bumps 8, as illustrated. The barrier metallization layer 5 and redistribution metallization layer 6 may also be patterned to interconnect different electrode pads 3.

The copper posts 7 extend upward from the grid points on the redistribution metallization layer 6, normal to the surface of the silicon substrate 2, and are electrically connected through the redistribution metallization layer 6 to the barrier metallization layer 5. The barrier metallization layer 5, redistribution metallization layer 6, and copper posts 7 are encased in a sealing layer 9 that exposes only the top ends of the copper posts 7. The sealing layer 9 comprises a material such as a plastic resin that provides mechanical and electrical protection for the semiconductor integrated circuit 1, and is the main component of its chip scale package.

The solder bumps 8 formed on the copper posts 7 are substantially hemispherical solder bodies that function as the external terminals through which electrical contact is made between the semiconductor integrated circuit 1 and external wiring. The solder bumps 8 are normally made from a lead-free solder, despite the tendency of lead-free solders to have a higher contact resistance than lead-containing solders. Contact resistances of about one ohm (1Ω) can be expected.

A semiconductor integrated circuit 1 may have more solder bumps 8 and copper posts 7 than the two illustrated in FIG. 2 or the twenty-five illustrated in FIG. 1, and the semiconductor integrated circuit 1 may include semiconductor circuit elements other than transistors. The circuitry in the semiconductor integrated circuit 1 may include logic circuits, memory circuits, switching circuits, and various other types of circuits.

Figure 3:
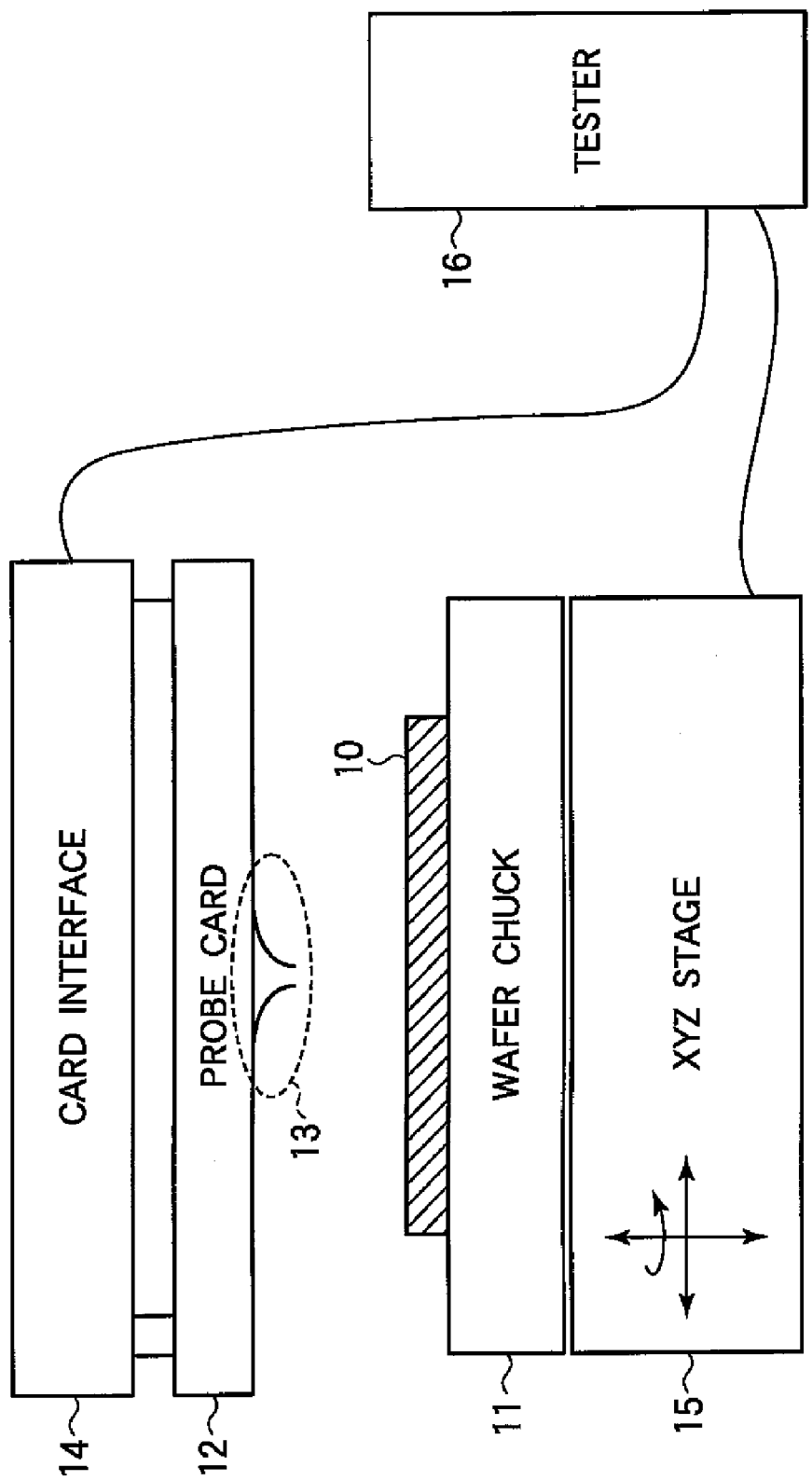
FIG. 3 is a side view illustrating apparatus for testing the semiconductor integrated circuits on the semiconductor wafer in FIG. 1.

When electrical tests are carried out on the semiconductor integrated circuit 1 in the wafer state, e.g., before dicing, the wafer 10 is mounted on a wafer chuck 11 as shown in FIG. 3, and held to the wafer chuck 11 by mechanical means or by vacuum suction. A probe card 12 having cantilevers 13 as probe pins is positioned above the wafer 10. The probe card 12 is mounted in a card interface 14. The wafer chuck 11 is mounted on a translatable and rotatable mechanism referred to as an XYZ stage 15 that can move the wafer 10 vertically and horizontally parallel to three axes (only the up-down axis and the right-left axis are shown in the drawing) and can also rotate the wafer 10 in a horizontal plane. These motions are controlled by a tester 16 to which both the card interface 14 and the XYZ stage 15 are connected. The wafer chuck 11, the probe card 12 and its cantilevers 13, the card interface 14, the XYZ stage 15, and the tester 16 are parts of a test machine sometimes referred to as a wafer prober.

During the electrical tests, the wafer chuck 11 is moved horizontally to position one or more chips on the wafer 10 under the cantilevers 13, and then moved vertically upward to bring the cantilevers 13 into electrical contact with solder bumps 8 or copper posts 7 on the one or more chips. The tester 16 tests the one or more chips by sending electrical signals to and receiving electrical signals from the cantilevers 13 through the probe card 12 and card interface 14. When the test is completed, the wafer chuck 11 is lowered and then moved horizontally to position a new chip or set of chips below the cantilever 13, and the same procedure is repeated to test these chips. This process continues until all the chips on the wafer 10 have been tested.

The probe card 12 comprises a substrate made of a material such as glass, epoxy, or polyimide, on which a conductive wiring pattern is formed. The cantilevers 13 are made of a material such as tungsten, beryllium-copper, or palladium and are partly embedded in and soldered to the probe card 12 in a pattern that varies depending on the type of chip to be tested and the type of test to be performed. The tips of the cantilevers 13 are, for example, about ten to two hundred micrometers (10-200 μm) in diameter, and have a contact resistance of 0.5Ω or less.

The invention is not limited to the use of cantilever probe pins as shown in the drawings. Pogo pins extending in a direction normal to the surface of the wafer 10 may be used instead.

Figure 4:
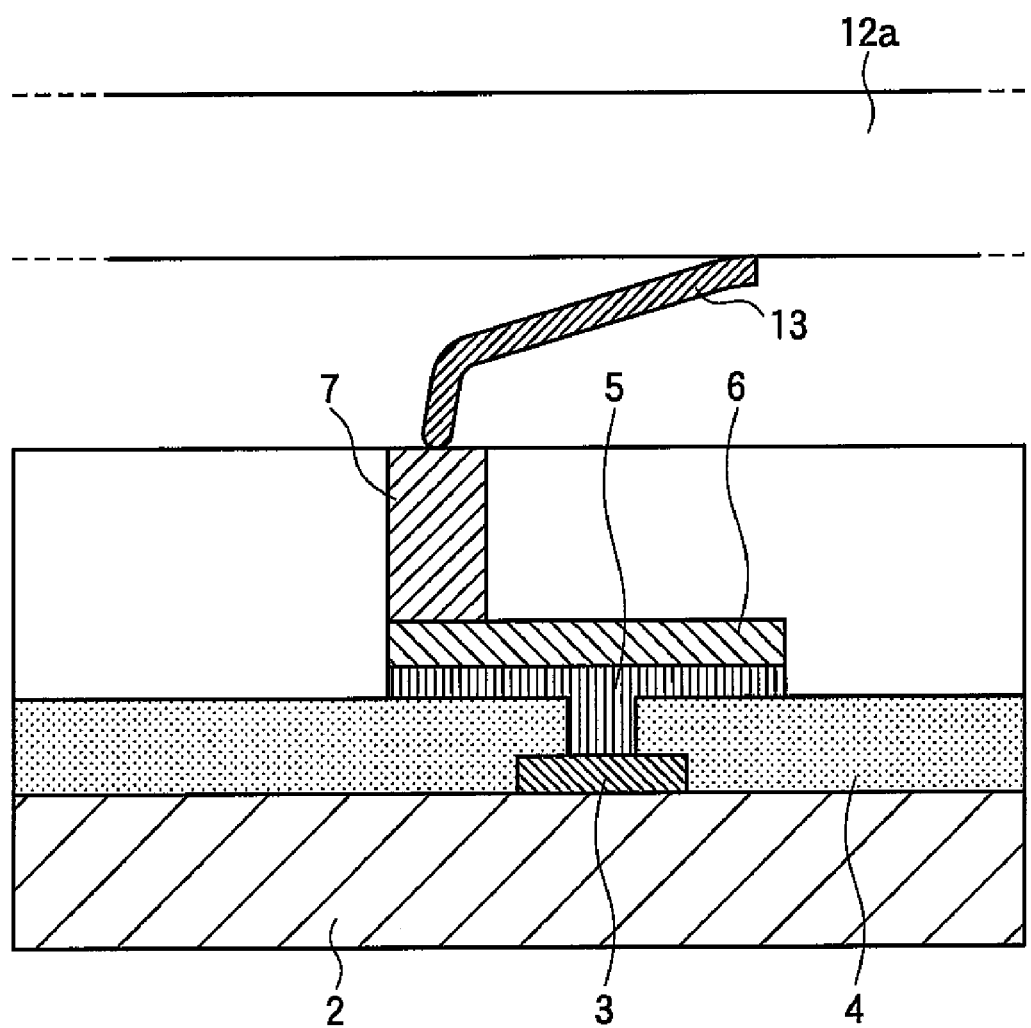
FIGS. 4 and 5 illustrate the two types of tests carried out in the novel test method.

FIG. 4 illustrates the electrical contact made between a cantilever 13 and a copper post 7 during the testing of the first electrical characteristics by the novel method. This test is carried out before the solder bumps 8 are formed; the electrical path between the cantilever 13 and the electrode pad 3 includes only the barrier metallization layer 5, redistribution metallization layer 6, and copper post 7. The first probe card 12a used in this test has cantilevers 13 disposed only in the positions of the copper posts 7 leading to the electrode pads 3 of the circuit elements to be tested.

Figure 5:
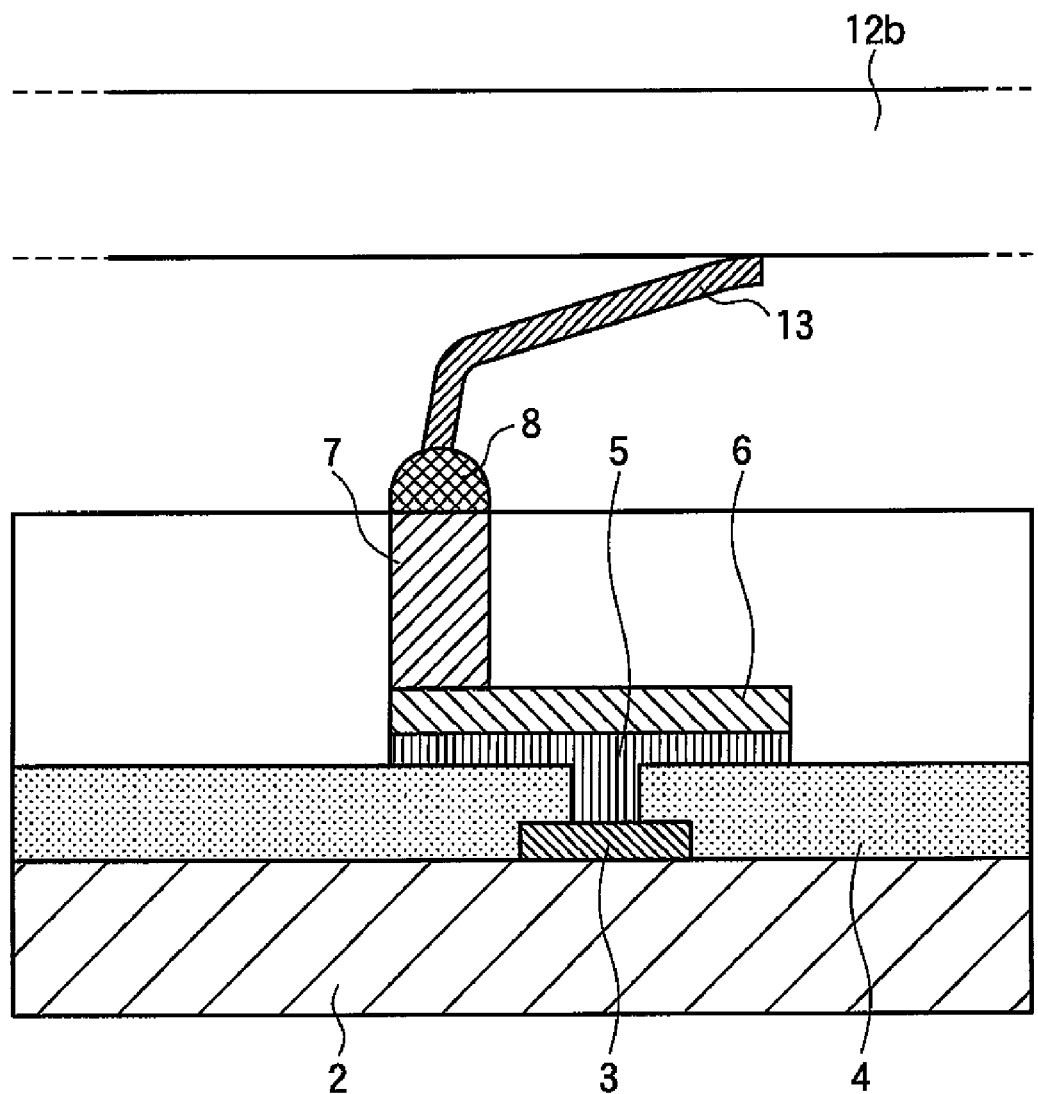

FIG. 5 illustrates the electrical contact made between a cantilever 13 and a solder bump 8 during the testing of the second electrical characteristics by the novel method. This test is carried out after the solder bumps 8 are formed; the electrical path between the cantilever 13 and the electrode pad 3 now includes the solder bump 8 as well as the barrier metallization layer 5, redistribution metallization layer 6, and copper post 7. The second probe card 12b used in this test has cantilevers 13 disposed only in the positions of the solder bumps 8 leading to the electrode pads 3 of the circuit elements to be tested.

Figure 6:
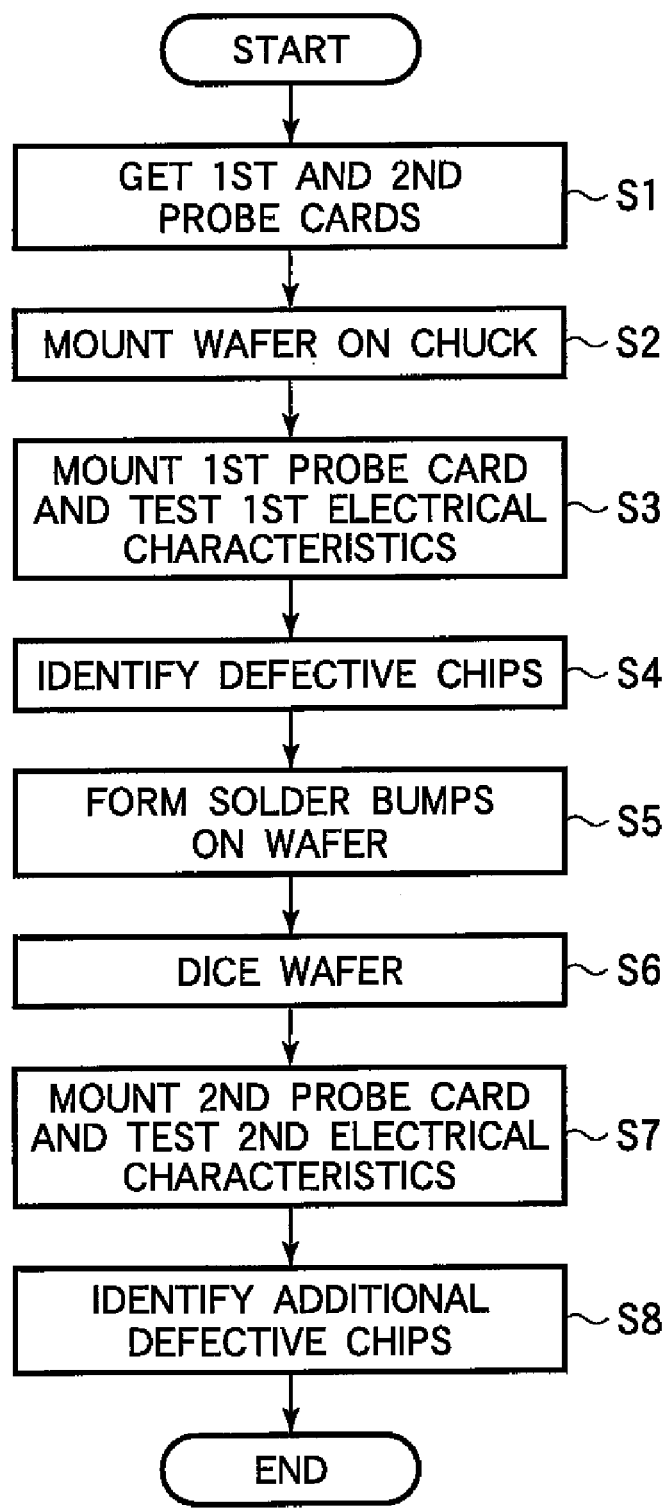
FIG. 6 is a flowchart illustrating the novel test method.

The test procedure is summarized in the flowchart in FIG. 6. The procedure begins after the copper posts 7 and the sealing layer 9 have been formed on the wafer 10, but before the solder bumps 8 are formed. The top ends of the copper posts 7 are exposed on the surface of the sealing layer 9.

Step S1 is a preparatory step in which a pair of probe cards 12a, 12b are obtained.

In step 52, the wafer 10 is mounted on the wafer chuck 11 in the test apparatus as shown in FIG. 3.

In step S3, the first probe card 12a is mounted in the card interface 14 in the test apparatus, and the wafer chuck 11 is driven by the tester 16 to bring the cantilevers 13 of the first probe card 12a into contact with a first set of copper posts 7 on the chip or chips being tested. The tests carried out in this state include tests of the on-resistance of switching transistors. The on-resistance of a transistor is tested by sending a signal to the transistor's gate electrode pad to turn the transistor on, feeding current from a constant current source to the transistor's source electrode pad, and measuring the resulting voltage at the transistor's drain electrode pad, using a voltage detector in the probe card 12a or tester 16. This test could not be carried out accurately after the solder bumps 8 are formed, because the unknown but non-negligible contact resistance of the cantilevers 13 against the lead-free solder bumps 8 would be added to the on-resistance of the transistor itself. Other electrical characteristics for which measurement accuracy is significantly affected by contact resistance may also be tested in this state.

In step S4, following the completion of the tests in step S3 for all chips on the wafer 10, defective chips are identified from the test results in step S3. For example, the result of an on-resistance test is compared with a threshold value; if the on-resistance exceeds the threshold value, the test fails and the chip is defective. Because of the lack of contact resistance due to the solder bumps 8, the threshold value can be set close to the maximum on-resistance at which the integrated circuit will operate normally; only a comparatively small margin need be allowed for measurement error.

In step S5, the wafer 10 is removed from the test apparatus and the solder bumps 8 are formed by, for example, screen printing of solder paste dots onto the ends of the copper posts 7, followed by melting of the printed dots of solder paste to form hemispherical bumps.

In step S6, the wafer 10 is attached to a so-called UV tape coated with an adhesive that loses its adhesion when exposed to ultraviolet light, and is diced into chips by a dicing machine, using a blade cutting process or laser cutting process. The individual chips are separated from each other but remain attached to the UV tape.

In step S7, the second probe card 12b is mounted in the card interface 14 in the test apparatus and the wafer chuck 11 is driven by the tester 16 to bring the cantilevers 13 of the second probe card 12b into contact with the solder bumps 8 formed on a second set of copper posts 7 on the chip or chips being tested. The tests carried out in this state are tests that are substantially unaffected by contact resistance between the cantilevers 13 and the solder bumps 8. Examples of such tests include tests of static characteristics such as current leakage and short circuits, and tests of dynamic characteristics, including current consumption tests and functional tests. Chips already identified as defective in step S4 are not tested.

In step S8, following the completion of the tests in step S7 for all chips that have not already been identified as defective in step S4, additional defective chips are identified from the test results in step S7. Chips that are identified as defective in the tests in either step S3 or step S7 are discarded, or in some cases set aside for repair. Chips that pass the tests in both steps S3 and S7 are ready for use, after detachment from the UV tape.

The order of steps S6 and S7 may be interchanged, provided problems of chip-to-chip interference do not arise. For example, the order of steps S6 and S7 may be interchanged if the chips are tested one at a time in step S7. Chip-to-chip interference may arise due to electrical continuity between signal terminals or ground lines in different chips when, for example, an entire row or column of chips is tested simultaneously. A specific example is a chip with an electrically open-circuited (discontinuous) ground line. If the defective ground line is connected to a ground line in an adjacent chip and both chips are tested simultaneously, the defective chip may operate normally and the defect may go undetected. When the possibility of such interference exists, the tests in step S7 are preferably carried out in the diced state after step S6.

Figure 7:
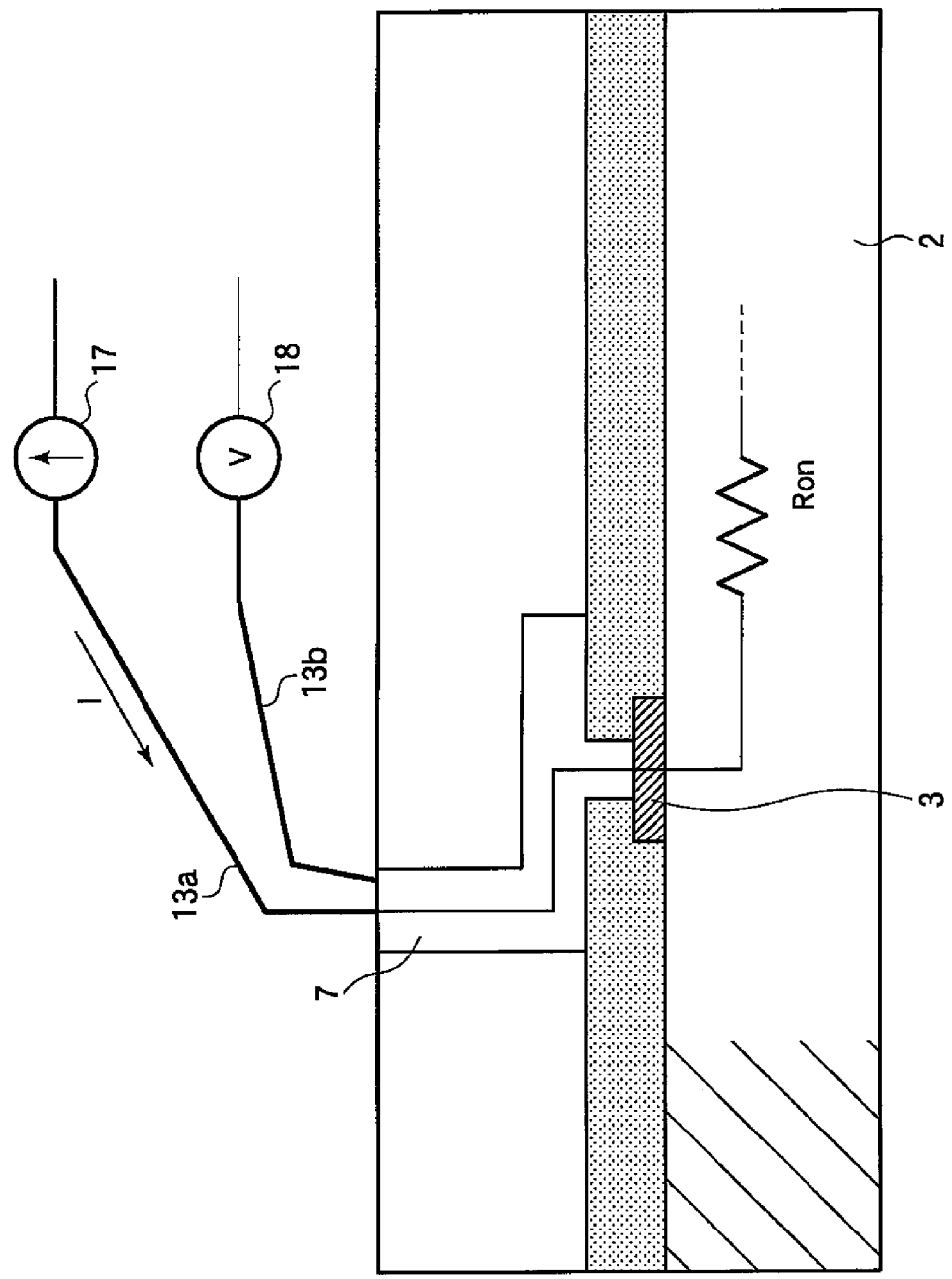
FIG. 7 illustrates another type of test carried out in the novel test method.

The first probe card 12a used in step S3 may include one or more Kelvin contacts. As illustrated in FIG. 7, a Kelvin contact includes a pair of probe pins 13a, 13b that both make contact with the same terminal, which is, in step S3, a copper post 7. Probe pin 13a is connected to a constant current source 17; probe pin 13b is connected to a voltage detector 18. The copper post 7 leads to the drain pad 3 of a transistor, the transistor being represented schematically by its on-resistance Ron. When the transistor is switched on during the test, the flow of the constant current (I) through the on-resistance (Ron) produces a voltage (I×Ron) that is measured by the voltage detector 18, and the on-resistance is calculated from this voltage and the known value Of the constant current.

In this test the flow of current through probe pin 13b is so slight that the voltage drop caused by the contact resistance between probe pin 13b and the copper post 7 is negligibly small, enabling the on resistance Ron to be measured with high accuracy.

Experiments performed by the inventor have shown that if the on-resistance of the same transistor is measured both in step S3, before the solder bumps 8 are formed, and in step S7, after the solder bumps 8 are formed, there is a difference of from 0.05Ω to 0.3Ω between the two measured values. It can be inferred that the difference is due to contact resistance between the cantilever 13 and the solder bump 8, and that this contact resistance is significantly large and highly variable. The variability is thought to be due to differences in material composition and morphology at the contact interfaces.

Since the expected value of the on-resistance of a typical transistor in an integrated circuit is about 1Ω, if the on-resistance is measured through the solder bumps 8 as in conventional test methods, accurate measurement is impossible; a large fraction of the measured value is likely to be measurement error. In contrast, the copper posts 7 are formed by a process that produces a consistent composition and shape. The tests carried out in step S3 of the procedure can therefore be expected to produce comparatively accurate values, especially if Kelvin contacts are used as in FIG. 7.

Although the novel test method requires electrical tests to be carried out in two stages, before and after the solder bumps 8 are formed, this procedure has the advantage that tests such as on-resistance tests that are susceptible to contact resistance effects can be carried out under conditions that minimize such effects, and tests that are susceptible to chip-to-chip interference can be carried out in the diced state, which precludes such interference. The manufacturing yield can accordingly be improved by measuring on-resistance values etc. accurately, while the throughput of the test procedure can be improved by performing other tests on multiple chips simultaneously.

Although a few variations have been mentioned in the foregoing description, those skilled in the art will recognize that further variations are possible within the scope of the invention, which is defined in the appended claims.

What is claimed is:

1. A method of testing the electrical characteristics of a plurality of semiconductor integrated circuits formed on a wafer, the method being carried out as part of a packaging process, the method comprising:
    forming a plurality of conductive posts on the wafer, the conductive posts making electrical contact with interconnection wiring of the integrated circuits;
    forming a sealing layer on the wafer, the sealing layer covering the interconnection wiring and exposing ends of the conductive posts;
    mounting a first probe card in a testing machine, the first probe card having probe pins disposed in first positions to make electrical contact with the ends of at least some of the conductive posts;
    using the first probe card to measure a first set of electrical characteristics of each of the semiconductor integrated circuits;
    After measuring the first set of electrical characteristics, forming terminals on the ends of the conductive posts;
    mounting a second probe card in a testing machine, the second probe card having probe pins disposed in second positions, differing at least in part from the first positions, to make electrical contact with at least some of the terminals formed on the conductive posts; and
    using the second probe card to measure a second set of electrical characteristics of at least some of the semiconductor integrated circuits.

2. The method of claim 1, wherein the first set of electrical characteristics includes electrical characteristics for which measurement accuracy is affected by contact resistance of the probe pins.

3. The method of claim 2, wherein the first set of electrical characteristics includes on-resistance of transistors.

4. The method of claim 3, further comprising:
    supplying current from a current source to a first set of the probe pins of the first probe card; and
    measuring voltages produced at a second set of the probe pins of the first probe card when said current is supplied to measure the on-resistance of the transistors.

5. The method of claim 4, wherein the plurality of conductive posts includes at least one conductive post making electrical contact with both one probe pin in the first set of the probe pins and one probe pin in the second set of the probe pins.

6. The method of claim 1, wherein the second set of electrical characteristics includes electrical characteristics for which measurement accuracy is substantially unaffected by contact resistance of the probe pins.

7. The method of claim 1, further comprising dicing the wafer into chips after measuring the second set of electrical characteristics.

8. The method of claim 1, further comprising dicing the wafer into chips after forming the terminals on the ends of the conductive posts but before measuring the second set of electrical characteristics.

9. The method of claim 8, wherein the second set of electrical characteristics includes electrical characteristics for which measurement accuracy is affected by interference between different ones of the semiconductor integrated circuits.

10. The method of claim 1, further comprising:
    identifying defective semiconductor integrated circuits on the basis of the first set or second set of electrical characteristics.

11. The method of claim 1, wherein the terminals are formed as solder bumps.

12. The method of claim 11, wherein the terminals are formed as lead-free solder bumps.

13. The method of claim 1, wherein the conductive posts, the sealing layer, and the terminals form part of a wafer-level chip-scale package for each of the semiconductor integrated circuits.

* * * * *